(12) United States Patent
Elkhatib et al.

(10) Patent No.: US 10,790,619 B2
(45) Date of Patent: Sep. 29, 2020

(54) SHIELDED CABLE SYSTEM FOR THE SHIELDING AND PROTECTION AGAINST EMI-LEAKAGE AND IMPEDANCE CONTROL

(71) Applicant: Cinch Connectors, Inc., Lombard, IL (US)

(72) Inventors: Hecham Elkhatib, Aurora, IL (US); Darijus Baltrukonis, Naperville, IL (US); Abel Almazan, St. Charles, IL (US)

(73) Assignee: Cinch Connectors, Inc., Lombard, IL (US)

( * ) Notice: Subject to any disclaimer, the term of this patent is extended or adjusted under 35 U.S.C. 154(b) by 0 days.

(21) Appl. No.: 16/033,978

(22) Filed: Jul. 12, 2018

(65) Prior Publication Data

US 2020/0021062 A1    Jan. 16, 2020

(51) Int. Cl.
*H01R 13/6592*    (2011.01)
*H01B 11/10*    (2006.01)
*H01R 9/05*    (2006.01)
*H01R 13/6581*    (2011.01)
*H05K 9/00*    (2006.01)

(52) U.S. Cl.
CPC ..... *H01R 13/6592* (2013.01); *H01B 11/1091* (2013.01); *H01R 9/0503* (2013.01); *H01R 13/6581* (2013.01); *H05K 9/0098* (2013.01)

(58) Field of Classification Search
CPC ............ H01R 13/6592; H01R 13/6593; H01R 13/6581; H01R 13/6583; H01R 13/6582
USPC ....................................................... 439/497
See application file for complete search history.

(56) References Cited

U.S. PATENT DOCUMENTS

| 4,337,989 | A | * | 7/1982 | Asick | H01R 13/6595 |
| | | | | | 174/359 |
| 4,544,227 | A | * | 10/1985 | Hirose | H01R 13/6583 |
| | | | | | 439/607.17 |
| 4,810,210 | A | | 3/1989 | Komatsu | |
| 5,038,001 | A | * | 8/1991 | Koegel | H01B 7/363 |
| | | | | | 174/112 |
| 5,281,762 | A | * | 1/1994 | Long | H01R 9/0515 |
| | | | | | 174/117 F |

(Continued)

FOREIGN PATENT DOCUMENTS

| DE | 103 35 609 A1 | 3/2005 |
| EP | 2 395 606 A1 | 12/2011 |
| EP | 2 942 841 A1 | 11/2015 |

*Primary Examiner* — Peter G Leigh
(74) *Attorney, Agent, or Firm* — Leydig, Voit & Mayer, Ltd.; John Augustyn

(57) ABSTRACT

The cable attaches a first component and a second component using a quick disconnect connector pair. The cable includes a twisted pair of wires with a separate shield. A portion of the shielding near the connector is removed to expose the wires and assemble the wires to the connector. To reduce the EMI leakage, the inner shell encloses the exposed portions of the wires. In order to maintain the ground path for the shielding of the shielded twisted wire pairs, the shielding for the twisted wire pairs is connected to the shell. The outer shells facilitate the quick disconnect feature. The outer shell includes one or more slots. The slot allows a portion of the outer shell to become a cantilever beam. The beam deflects during disengagement and engagement with the outer shell.

27 Claims, 17 Drawing Sheets

(56) References Cited

U.S. PATENT DOCUMENTS

| | | | | |
|---|---|---|---|---|
| 5,338,227 A * | 8/1994 | Nakamura | H01R 13/506 | 439/352 |
| 5,470,238 A * | 11/1995 | Walden | H01R 12/775 | 439/98 |
| 5,641,310 A * | 6/1997 | Tiberio, Jr. | H01R 13/625 | 439/680 |
| 5,766,041 A * | 6/1998 | Morin | H01R 13/74 | 439/607.19 |
| 6,045,389 A * | 4/2000 | Ferrill | H01R 9/031 | 439/398 |
| 6,056,577 A * | 5/2000 | Blanchet | H01R 13/639 | 439/352 |
| 6,203,376 B1 * | 3/2001 | Magajne | H01R 13/5845 | 439/607.44 |
| 6,354,879 B1 * | 3/2002 | Plehaty | H01R 9/032 | 439/607.41 |
| 6,454,605 B1 * | 9/2002 | Bassler | H01R 9/034 | 439/607.23 |
| 6,607,308 B2 * | 8/2003 | Dair | G02B 6/4246 | 385/92 |
| 7,094,103 B2 * | 8/2006 | Lai | H01R 9/032 | 439/607.45 |
| 7,427,715 B2 * | 9/2008 | Kuo | H01R 13/5845 | 174/74 R |
| 7,651,379 B1 * | 1/2010 | Wu | H01R 12/62 | 439/108 |
| 7,909,647 B2 * | 3/2011 | Kawaguchi | H01R 9/035 | 439/585 |
| 8,002,572 B2 * | 8/2011 | Lu | H01B 7/0892 | 439/405 |
| 8,215,977 B2 * | 7/2012 | Zapf | H01R 13/6273 | 439/352 |
| 8,348,699 B2 * | 1/2013 | Nagawatari | H01R 13/6589 | 439/607.01 |
| 8,496,495 B2 | 7/2013 | Kari | | |
| 8,500,489 B2 * | 8/2013 | Lu | H01B 7/0892 | 439/607.45 |
| 8,500,494 B2 * | 8/2013 | Wu | H01R 13/6461 | 439/660 |
| 8,507,796 B2 * | 8/2013 | Lu | H01B 7/0892 | 174/113 R |
| 8,523,602 B2 * | 9/2013 | Figie | H01R 13/502 | 439/466 |
| 8,579,519 B2 * | 11/2013 | Wu | G02B 6/3817 | 385/101 |
| 8,591,259 B2 * | 11/2013 | Wu | H01R 13/6581 | 439/607.27 |
| 8,597,060 B2 * | 12/2013 | Wu | H01R 13/6471 | 439/660 |
| 8,662,933 B2 * | 3/2014 | Wu | H01R 13/6585 | 439/660 |
| 8,668,523 B2 * | 3/2014 | Wu | H01R 13/6581 | 439/607.23 |
| 8,684,764 B2 * | 4/2014 | Figie | H01R 13/502 | 439/466 |
| 8,696,385 B2 * | 4/2014 | Wu | H01R 13/6581 | 439/607.56 |
| 8,814,599 B2 * | 8/2014 | Wu | H01R 13/5808 | 439/607.48 |
| 9,244,240 B2 * | 1/2016 | Hayashishita | G02B 6/4434 | |
| 9,413,116 B1 | 8/2016 | Villasenor et al. | | |
| 9,431,767 B2 * | 8/2016 | Wu | H01R 13/6463 | |
| 9,508,467 B2 * | 11/2016 | Pon | H01B 9/003 | |
| 9,543,710 B2 * | 1/2017 | Dunwoody | H01R 13/6592 | |
| 9,607,738 B1 * | 3/2017 | Wu | H01B 11/20 | |
| 9,979,145 B2 * | 5/2018 | Wu | H01R 24/60 | |
| 2010/0051318 A1 * | 3/2010 | Wang | H01B 11/12 | 174/113 R |
| 2010/0081302 A1 * | 4/2010 | Atkinson | H01R 13/6474 | 439/98 |
| 2010/0084157 A1 * | 4/2010 | Wang | H01B 11/12 | 174/107 |
| 2010/0120282 A1 | 5/2010 | Williams et al. | | |
| 2011/0278043 A1 * | 11/2011 | Ueda | H01B 7/1895 | 174/115 |
| 2012/0103651 A1 * | 5/2012 | Kim | H01B 11/1808 | 174/102 R |
| 2016/0190742 A1 | 6/2016 | Jozwik et al. | | |
| 2016/0294135 A1 * | 10/2016 | Susini | H01R 13/64 | |
| 2018/0109039 A1 | 4/2018 | Maesoba | | |
| 2018/0131130 A1 * | 5/2018 | Stucchi | H01R 13/5202 | |

* cited by examiner

SHIELDED CABLE SYSTEM FOR THE SHIELDING AND PROTECTION AGAINST EMI-LEAKAGE AND IMPEDANCE CONTROL

BACKGROUND OF THE INVENTION

Electrical cables are used to connect various electrical and electronic components. In addition, electrical cables may need to satisfy certain electrical characteristics, such as, impedance or Electromagnetic Interference ("EMI") leakage and physical characteristics, such as, size or weight. Also, electrical cables may need to be disconnected from the electrical components. The invention relates to a new cable system.

BRIEF SUMMARY OF THE INVENTION

The invention provides a cable which may be attached to a first component and a second component. In one embodiment, the first component may be a helmet to be worn by a pilot or driver. In one embodiment, the second component is a control box. The cable may include a first connector pair. In one embodiment, the first connector pair may be a quick disconnect connector pair. The first connector pair may include a first connector and a second connector. For example, the user of the first component (for example, helmet) may use the connector to connect and disconnect from the second component (for example, control box) when the user enters and exits the vehicle.

The cable may include wires or conductors. In one embodiment, the cable may include nineteen wires to transmit signals and/or power. In other embodiments, the cable may include fiber optic conductors, or other types of conductors.

In one embodiment, the wires may include a twisted pair of wires. The twisted pair of wires may have a separate shield. The twisted pair of wires with the shield may provide controlled impedance for the wires. In one embodiment the cable may have six pairs of the shielded twisted wire pair assemblies.

When the shielded twisted wire pair assemblies are assembled to the connector, a portion of the shielding near the connector may be removed to expose the wires. When the shielding is separated from the shielded twisted wire pair assembly, portions of the wires do not have the shielding. These exposed portions may cause EMI leakage. To reduce the EMI leakage, the inner shell encloses the exposed portions of the wires. The inner shell extends to cover the exposed portions of the wires.

In order to maintain the ground path for the shielding of the shielded twisted wire pairs, the shielding is connected to the shell. The shielding is connected to the shell to maintain the ground along the signal paths for the wires. In one embodiment, the shielding for each wire pair can share the same ground path. Thus, the shielding for each shielded wire pair can be connected to the shell.

The cable may include a shielding layer. The shielding layer may reduce or eliminate EMI leakage. In one embodiment, a separating layer may be positioned between the shielded twisted wire pair assemblies and the shielding layer.

The connector may include an outer shell. The outer shell may shield the connector. The shielding layer may be connected to the outer shell. The connection of the shielding layer with the outer shell will create shielding along the cable.

The connector may include an insulator between the outer shell and the inner shell to insulate the shielding from the ground path.

The connector pair may be a quick disconnect connector. The connector and connector may disconnect at 10-15 pounds. The outer shells facilitate the quick disconnect feature. The outer shell includes one or more slots. The slots allow a portion of the outer shell to become a cantilever beam. The beams are allowed to deflect during disengagement and engagement with the outer shell. The deflection can be used to control the amount of disconnect force.

The cable may have additional wires. The additional wires may be located closer to the center of the cable than the shielded twisted wire pair assemblies. In one embodiment, the additional wires may be a combination of twisted pairs and individual wires. For example, in an embodiment with seven additional wires, the combination may be a single wire and three twisted pairs of wires.

DESCRIPTION OF THE INVENTION

Figure 1:
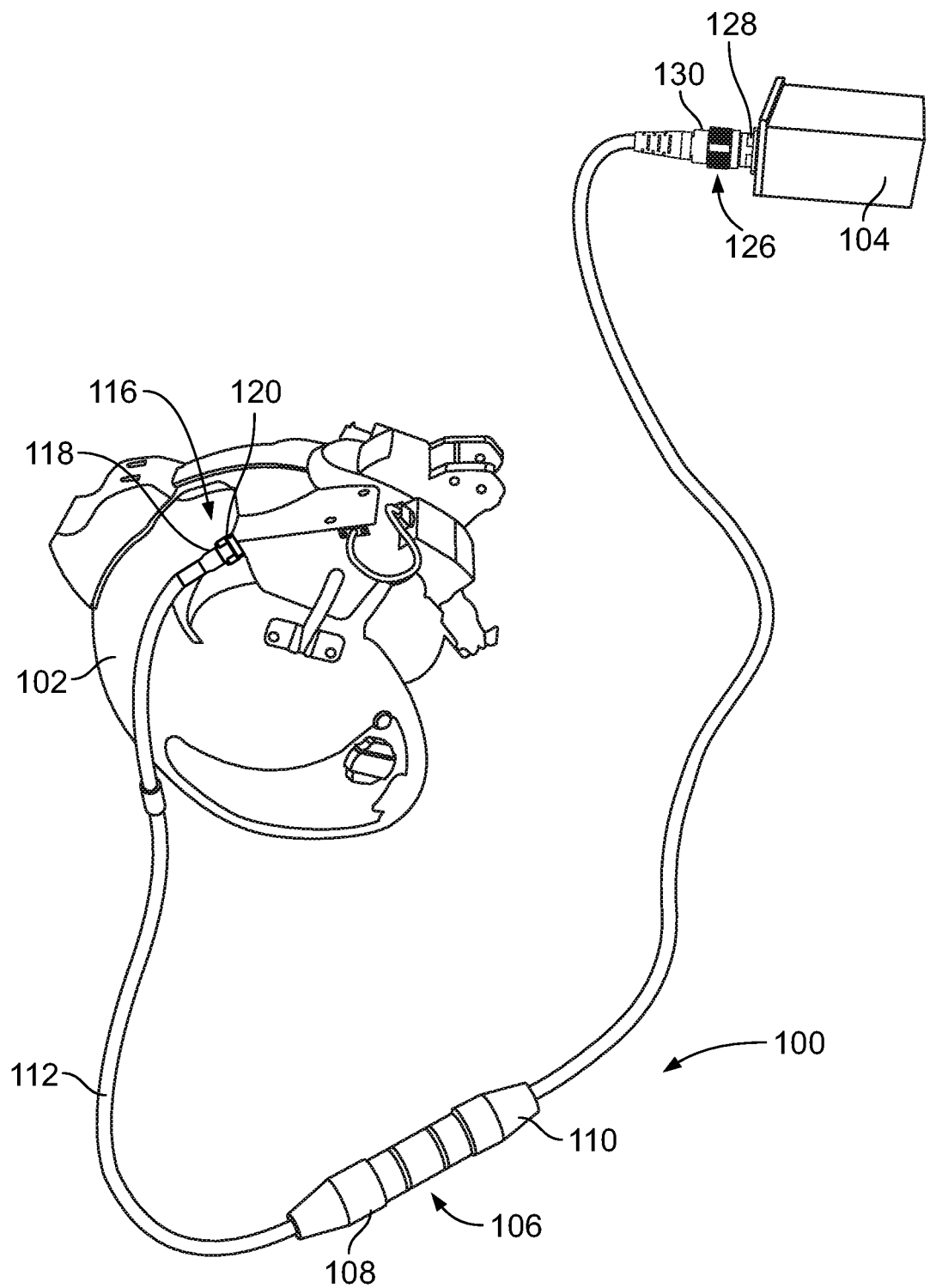
FIG. 1 is a perspective view of the cable attached to a helmet and a control box.

Referring to FIG. 1, the cable 100 is shown. In one embodiment, the cable 100 is attached to a first component 102 and a second component 104. In one embodiment, the first component 102 may be a helmet to be worn by a pilot or driver. In other embodiments, the component 102 may be control system, an interface panel, or other component. In one embodiment, the second component 104 is a control box. The control box may be attached to the vehicle. In other embodiments, the component 104 may be an interface panel, or other component.

The cable 100 may include a first connector pair 106. In one embodiment, the first connector pair 106 may be a quick disconnect connector pair. The first connector pair 106 may include a first connector 108 and a second connector 110. The first connector 108 may be connected and disconnected from the second connector 110. In one embodiment, the connector 106 may be used to connect and disconnect the first component 102 from the second component 104. For example, the user of the first component 102 (for example, helmet) may use the connector 106 to connect and disconnect from the second component 104 (for example, control box) when the user enters and exits the vehicle. The connector pair 106 may have a disconnecting force of 10-15 pounds.

The cable 100 may be connected to the first component 102 with a second connector pair 116. The second connector pair 116 may include a third connector 118 and a fourth connector 120. In one embodiment, the second connector pair 116 may be a Nano-D connector pair.

The cable 100 may include a first wire assembly 112. The first wire assembly 112 is connected to the first connector 108 and the third connector 118.

The cable 100 may be connected to the second component 104 with a third connector pair 126. The third connector pair 126 may include a fifth connector 128 and a sixth connector 130. In one embodiment, the third connector pair 126 may be a 38999 connector pair.

The cable 100 may include a second wire assembly 114. The second wire assembly 114 is connected to the second connector 110 and the fifth connector 128.

Figure 2:
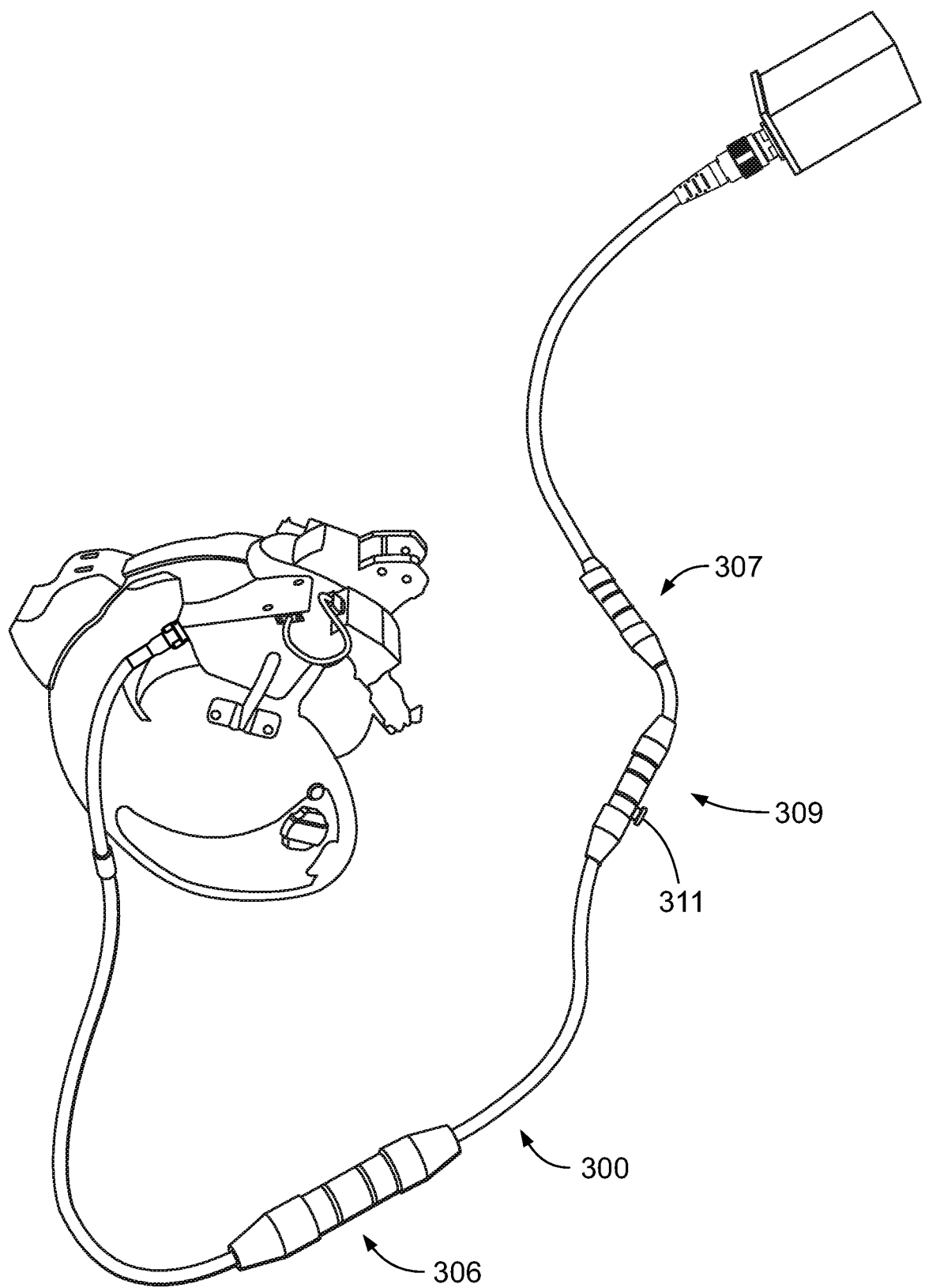
FIG. 2 is a perspective view of another embodiment of the cable.

Referring to FIG. 2, another embodiment of the cable is shown. The cable 300 may include additional first connector pairs. The cable 300 may include a first connector pair 306 which may be similar to first connector pair 106. The cable 300 may include fourth connector pair 307 which may be similar to first connector pair 306. Fourth connector pair 307 may have a higher disconnecting force than first connector pair 306. First connector pair 306 may have a disconnecting force of 10-15 pounds. Fourth connector pair 307 may have a disconnecting force of 40-50 pounds. The cable 300 may include fifth connector pair 309 which may be similar to first connector pair 306. Fifth connector pair 309 may have a higher disconnecting force than first connector pair 306. Fifth connector pair 309 may have a disconnecting force of 40-50 pounds. First connector pair 306 may have a disconnecting force of 10-15 pounds. Fifth connector pair 309 may include a bracket 311. The bracket 311 may be used to attach to a mating bracket. In one embodiment, the mating bracket may be on the user's clothing. In one embodiment, the bracket may be on the user's belt.

Figure 3:
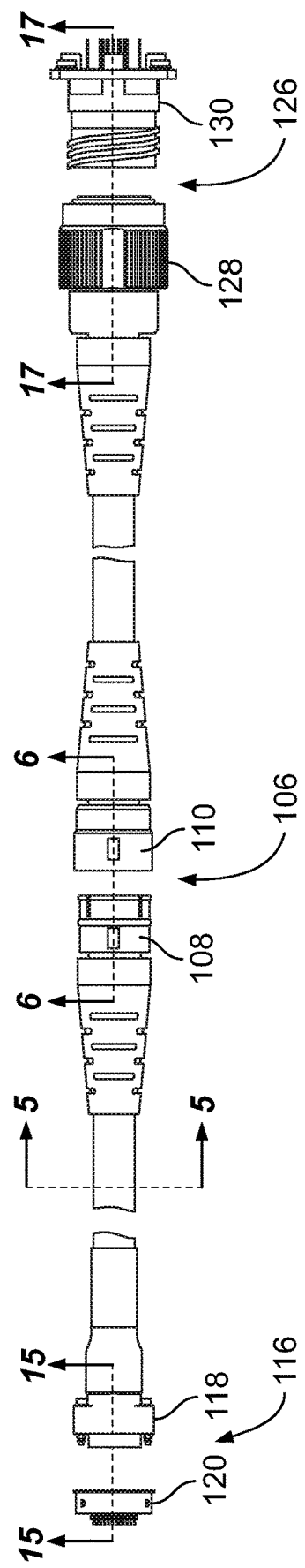
FIG. 3 is a top view of the cable and connectors in FIG. 1 with the cable disconnected at the connectors.

Referring to FIG. 3, the cable 100 is shown with the cable disconnected at the connectors. The cable 100 is disconnected at the first connector pair 106. Specifically, the first connector 108 is disconnected from the second connector 110. The cable is also disconnected at the second connector pair 116. Specifically, the third connector 118 is disconnected from the fourth connector 120. The cable is also disconnected at the third connector pair 126. Specifically, the fifth connector 128 is disconnected from the sixth connector 130.

Figure 4:
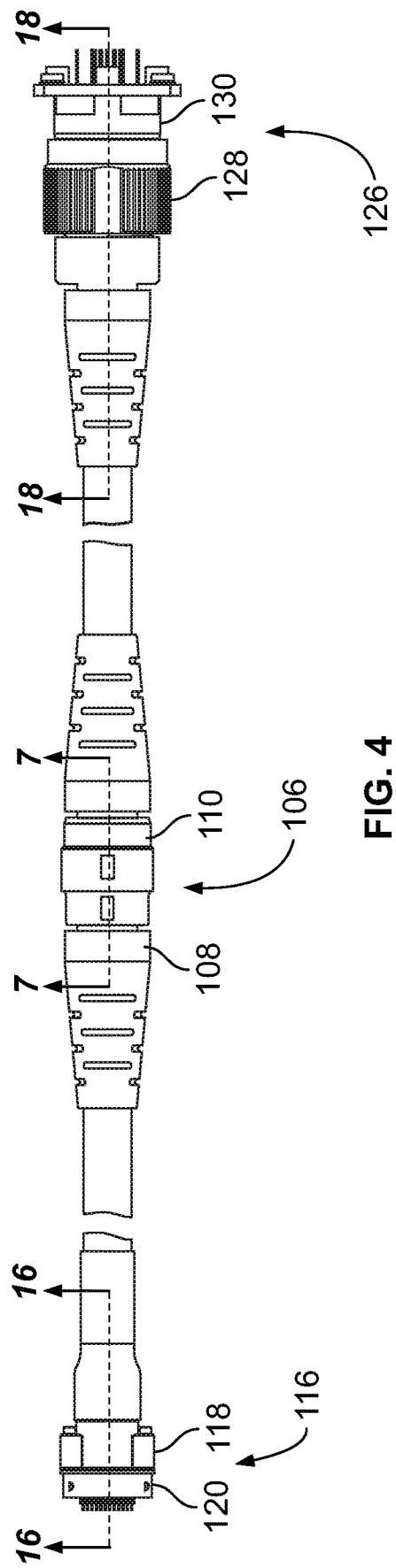
FIG. 4 is a top view similar to FIG. 3 but the cable is connected at the connectors.

Referring to FIG. 4, the cable 100 is shown with cable connected at the connectors. The cable 100 is connected at the first connector pair 106. Specifically, the first connector 108 is connected to the second connector 110. The cable is also connected at the second connector pair 116. Specifically, the third connector 118 is connected to the fourth connector 120. The cable is also connected at the third connector pair 126. Specifically, the fifth connector 128 is connected to the sixth connector 130.

Figure 5:
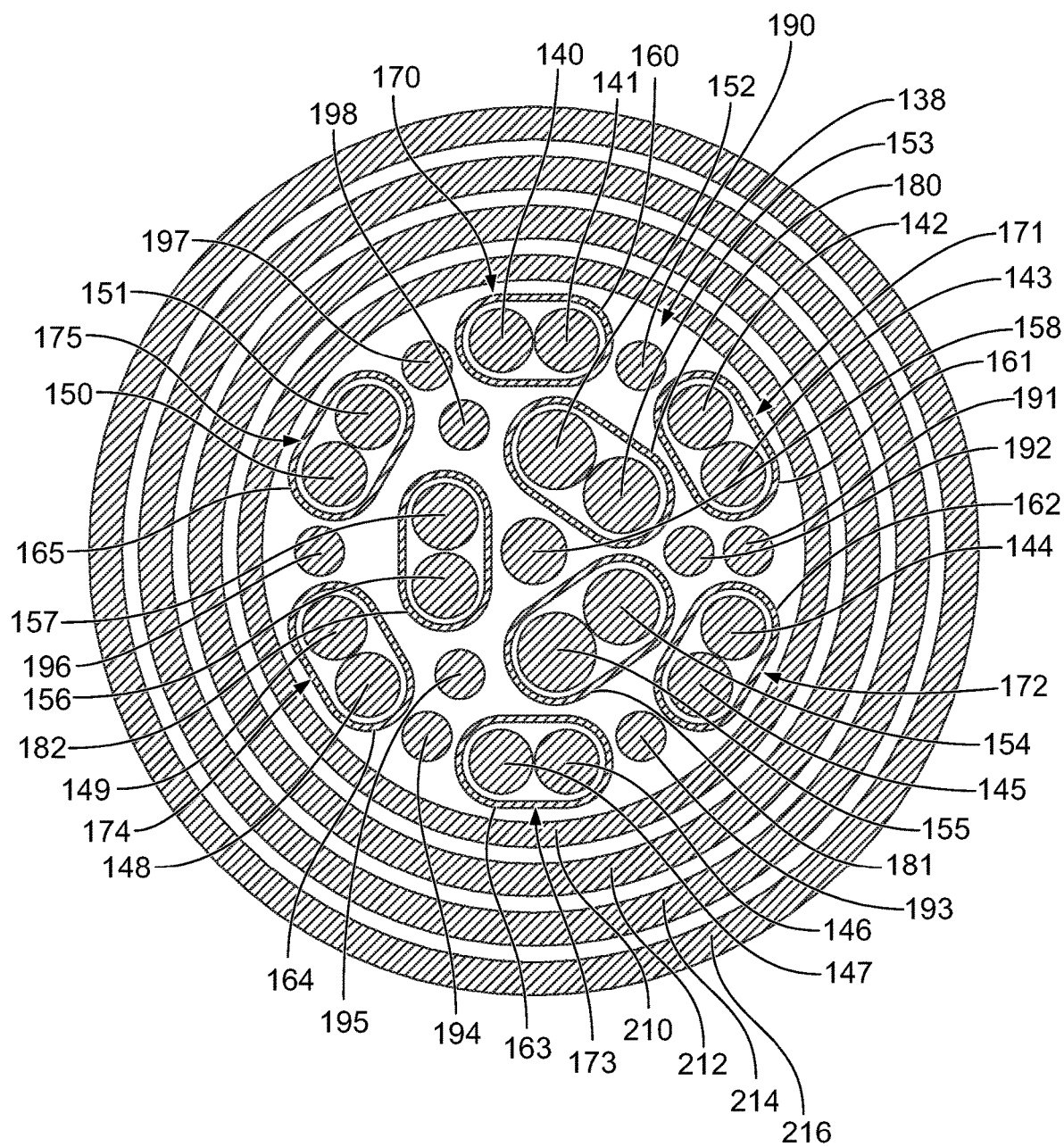
FIG. 5 is a cross-sectional view along line 5-5 in FIG. 4.

Referring to FIG. 5, the cable 100 may include wires or conductors 138. In one embodiment, the wires may include a conductive portion and an insulation material over the conductive portion. In one embodiment, the cable may include nineteen wires or conductors 140-158. In another embodiment, the cable may include 25 wires. In other embodiments, the cable may include 2, 3, 4, 5, 6, 7, 8, 9, 10, 11, 12, 13, 14, 15, 16, 17, 18, 20, 21, 22, 23, 24, 26 or more wires. In other embodiments, the cable may include fiber optic conductors, or other types of conductors to transmit signals and/or power.

Referring to FIG. 5, in one embodiment, the wires may include a twisted pair of wires 140, 141. The twisted pair of wires 140, 141 may have a separate shield 160. The twisted pair of wires 140, 141 and the separate shield 160 are assembled into a shielded twisted wire pair assembly 170. The shield 160 surrounds the twisted pair of wires 140, 141. The twisted pair of wires with the shield may provide controlled impedance for the wires 140, 141. In one embodiment, the shield may be a tubular shield. In one embodiment, the shield may be a braided shield. The braided shield may be formed by weaving metal threads to create the shielding material.

In one embodiment the cable may have six pairs of the shielded twisted wire pair assemblies. For example, the cable may include a second shielded twisted wire pair assembly 171 with a second twisted wire pair 142, 143 and shield 161, a third shielded twisted wire pair assembly 172 with a third twisted wire pair 144, 145 and shield 162, a fourth shielded twisted wire pair assembly 173 with a fourth twisted wire pair 146, 147 and shield 163, a fifth shielded twisted wire pair assembly 174 with a fifth twisted wire pair 148, 149 and shield 164, and a sixth shielded twisted wire pair assembly 175 with a sixth twisted wire pair 150, 151 and shield 165. In other embodiments, the cable may have 1, 2, 3, 4, 5, 7, or more pairs of the shielded twisted wire pair assemblies. The shielded twisted wire pair assemblies 170-175 may be located on the perimeter of the cable 100. In one embodiment, the shielded twisted wire pairs may be 28 AWG wire size.

Referring to FIG. 5, the cable may have wires 152-158. The wires 152-158 may be located toward the center of the cable. The wires 152-158 may be located closer to the center of the cable than the shielded twisted wire pair assemblies 140-151. The shielded twisted wire pair assemblies 140-151 may be located further from the center of the cable than the wires 152-158. The wires may transmit signals or power. In one embodiment, the cable may have seven wires 152-158. In other embodiments, the cable may have 1, 2, 3, 4, 5, 6, 8, or more wires. In one embodiment, the wires may be twisted pairs. In one embodiment, the wires may be a combination of twisted pairs and individual wires. For example, in an embodiment with seven wires, the combination may be a single wire 158 and three twisted pairs of wires 152-157. Other embodiments may have other combinations, such as: three single wires and two twisted pairs; or five single wires and one twisted pair.

Referring to FIG. 5, in one embodiment the cable may have six pairs of shielded twisted wire pair assemblies 140-151 and seven wires 152-158. In other embodiments, the cable may have any combination of 1, 2, 3, 4, 5, 6, or 7 more pairs of shielded twisted wire pair assemblies and 1, 2, 3, 4, 5, 6, 7, 8 or more non-shielded wires.

Referring to FIG. 5, the twisted pair 152, 153 may be covered with a covering 180. In one embodiment, the cable may include a second twisted pair of wires 154, 155 and a covering 181. In an additional embodiment, the cable may include a third twisted pair of wires 156, 157 and a covering 182. In one embodiment, the covering may be a Teflon tape. In one embodiment, two of the twisted pairs 152-155 may be 24 AWG wire size, one twisted pair 156, 157 may be 28 AWG wire size, and the single wire 158 may be 28 AWG wire size.

The cable may include one or more filler strands. The filler strands may assist in maintaining the spacing among the wires 140-151, wires 152-157, and wire 158. In one embodiment, the cable may include nine filler strands 190-198. The filler strands may be made of LSNW (Low Shrink Non-Wick) polyester. In other embodiments, the filler strands may be made of other materials.

Referring to FIG. 5, the cable may include a covering 210 over the wires. In one embodiment, the covering 210 may be a Teflon tape. The cable may include another covering 212. In one embodiment, the covering 212 may be a Kevlar braid.

Referring to FIG. 5, the cable may include a shielding layer 214. The shielding layer 214 may reduce or eliminate EMI leakage. In one embodiment, the shielding layer 214 may be shielding braid. In one embodiment, the shielding layer 214 does not make contact with the shielded twisted wire pair assemblies 170-175. The shielded twisted wire pair assemblies 170-175 may be isolated from the shielding layer 214. In one embodiment, a separating layer may be positioned between the shielded twisted wire pair assemblies 170-175 and the shielding layer 214. The separating layer may prevent contact between the shielded twisted wire pair assemblies 170-175 and the shielding layer 214. The separating layer may also isolate the shielded twisted wire pair assemblies 170-175 from the shielding layer 214.

In one embodiment, the separating layer may be the covering 160-165. In another embodiment, the separating layer may be the covering 210. In further embodiment, the separating layer may be the covering 212. In an additional embodiment, the separating layer may be one or more of the covering 160-165, covering 210, or covering 212.

Referring to FIG. 5, the cable may include an outer covering 216. In one embodiment, the outer covering 216 may be braided. In one embodiment, the outer covering 216 may be made of a material which is fire-resistant. For example, the covering 216 may be made of Nomex. In one embodiment, the Nomex may be braided.

Figure 6:
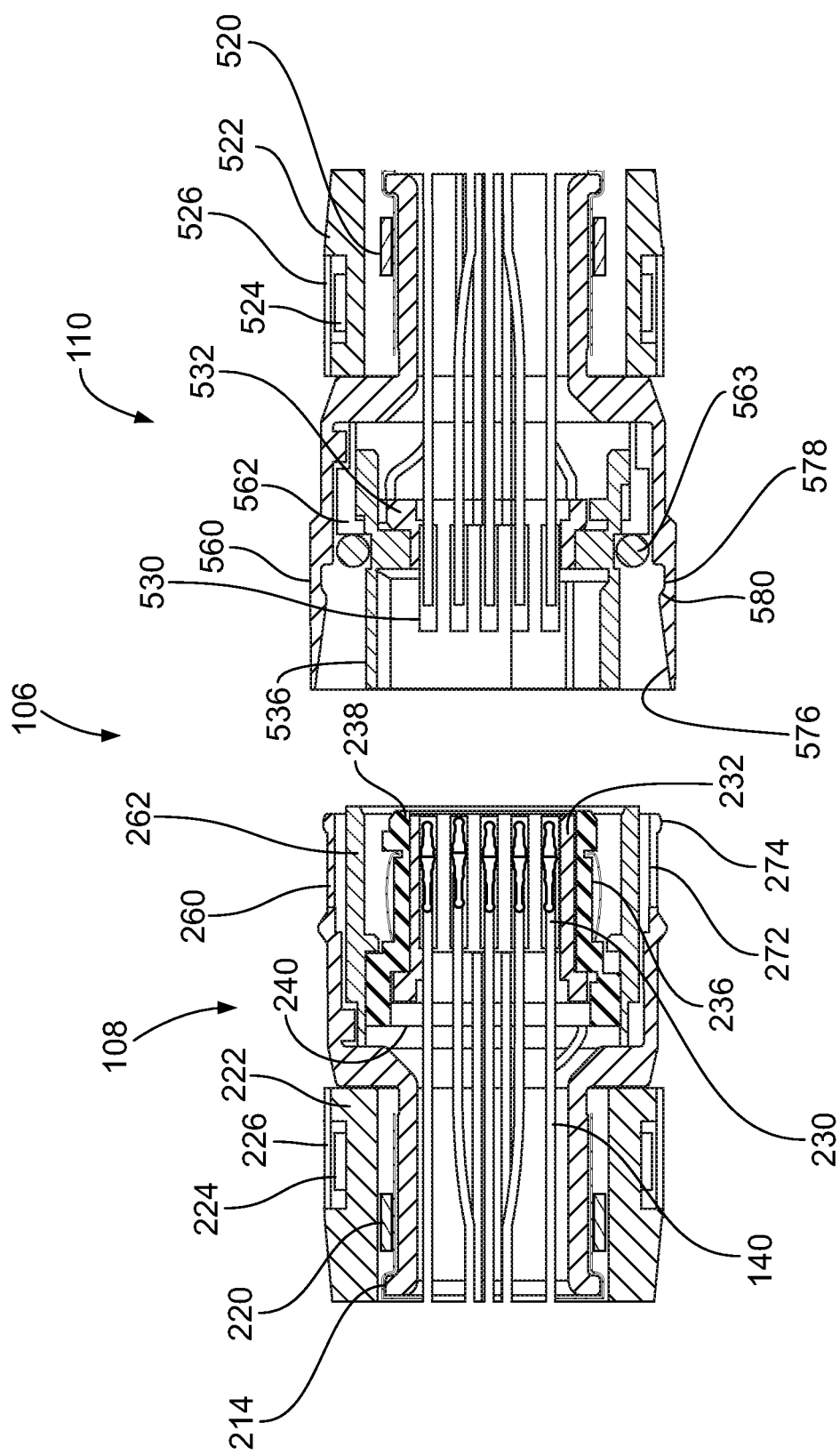
FIG. 6 is a cross-sectional view along line 6-6 in FIG. 3.
Figure 7:
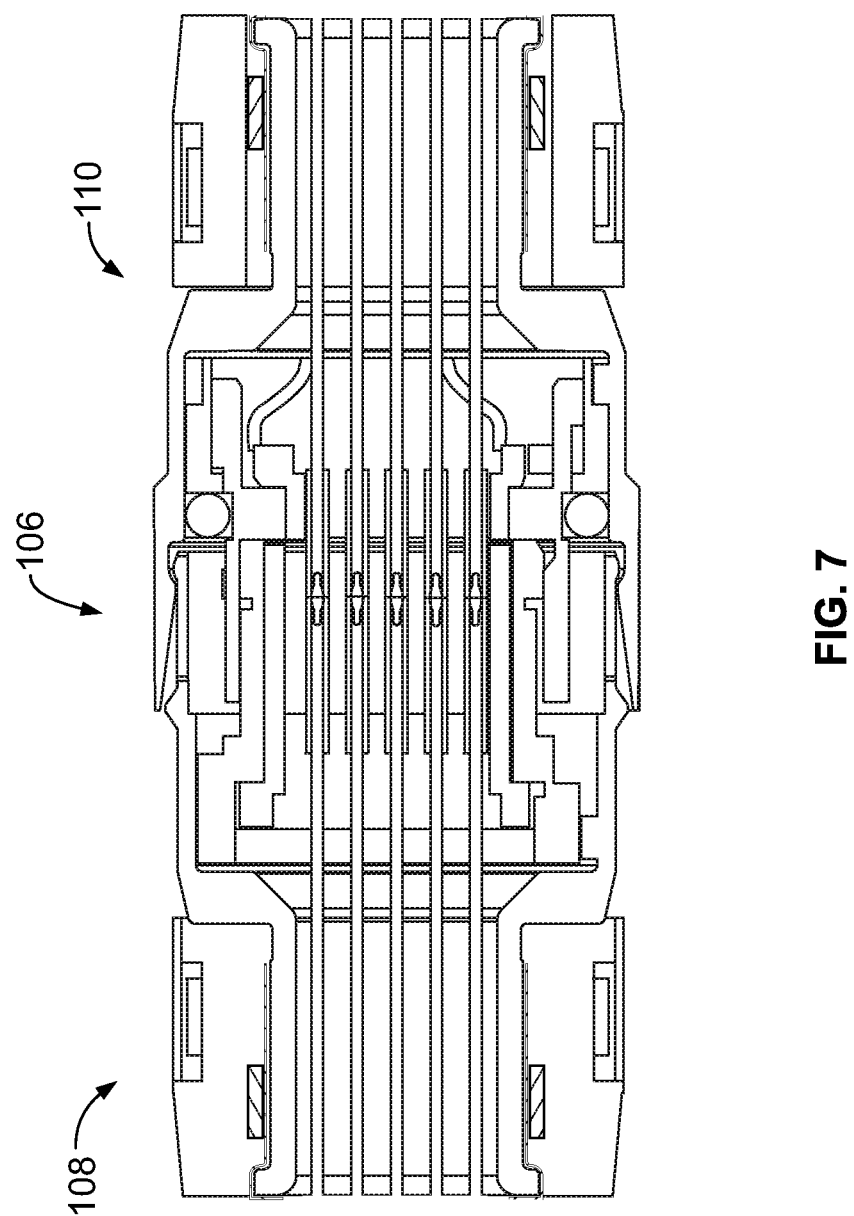
FIG. 7 is a cross-sectional view along line 7-7 in FIG. 4.
Figure 8:
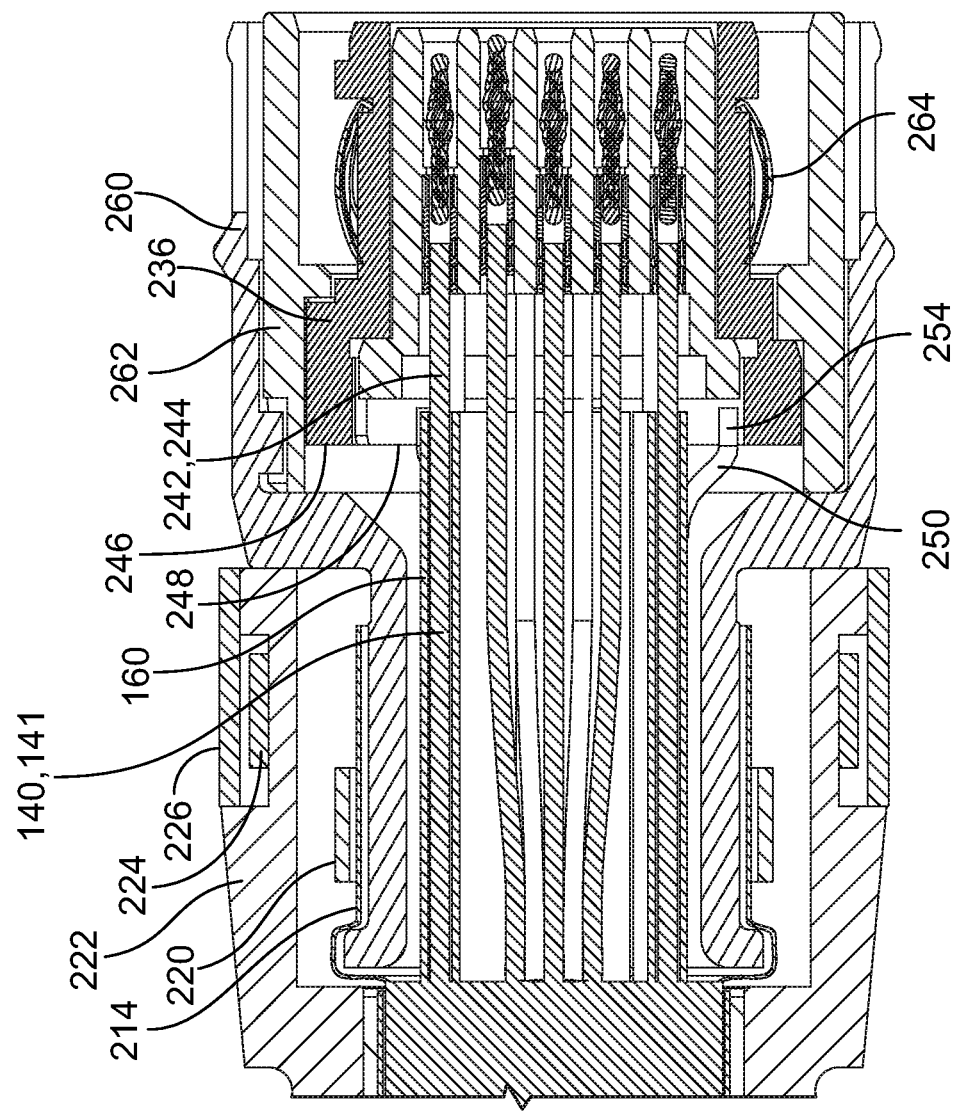
FIG. 8 is an enlarged cross-sectional view.

Referring to FIGS. 6 and 8, the shielding layer 214 may be attached to the connector. In one embodiment, the shielding layer 214 may be attached with a band clamp 220. In other embodiments, the shielding layer 214 may be attached using other techniques.

The cable may include a strain relief boot 222 which may be attached to the connector. In one embodiment, the strain relief boot 222 may be attached with a band clamp 224. In other embodiments, the strain relief boot may be attached using other techniques. The band clamp 224 may have a covering 226. In one embodiment, the covering 226 may be heat shrink tubing. In other embodiments, the covering 226 may be other materials.

FIG. 6 is a cross-sectional view of the connector pair 106 taken along line 6-6 in FIG. 3. Referring to FIG. 6, the first connector 108 may include a contact 230. In one embodiment, the contact may be a pin contact or a female contact. The contact 230 may be attached to a wire. The wire may be one of the wires 140-158. Wire 140 will be used as an example for the following discussion. The wire 140 may include an insulation material over the conductive portion of the wire. A portion of the insulation may be removed at the location where the contact 230 is attached to the wire. The wire 140 may be attached by crimping the contact 230 onto the portion of the wire without insulation. In another embodiment, the wire may be soldered to the contact. In an additional embodiment, the wire may be attached to the contact by another connection technique.

Figure 10:
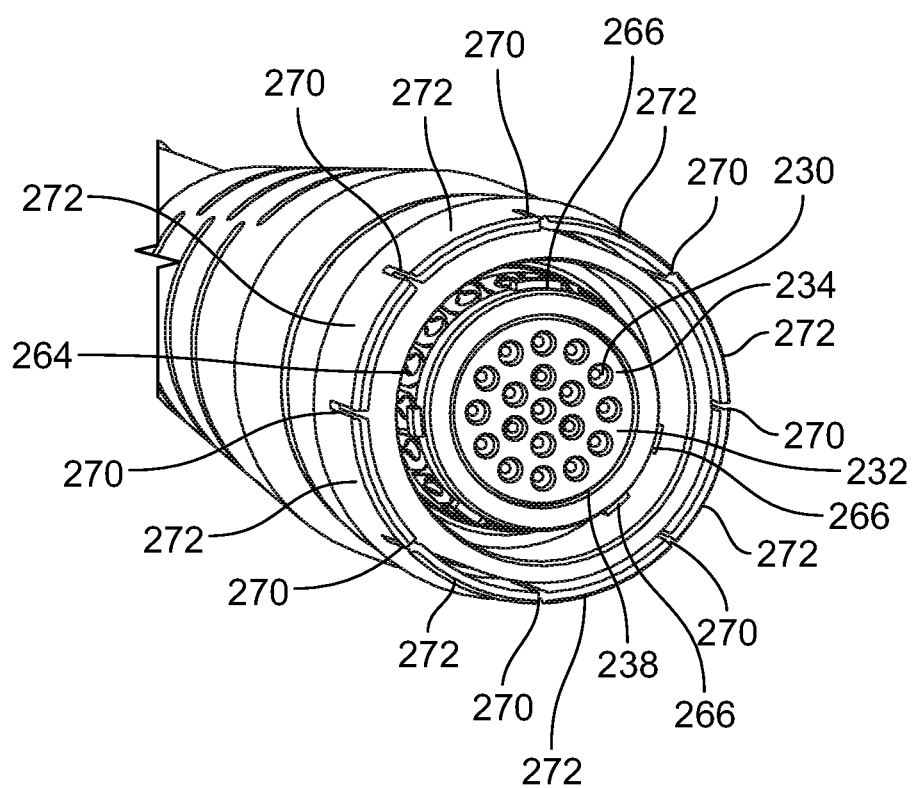
FIG. 10 is a perspective view of the female end of quick disconnect connector.

Referring to FIG. 10, the connector 108 may include nineteen contacts 230. In other embodiments, the connector may have more or less than nineteen contacts.

The size of the contact 230 depends upon the intended use of the cable. In one embodiment, the contact 230 is sized for use with 24 AWG size wire. In another embodiment, the contact 230 may be sized for use with 28 AWG size wire. In other embodiments, the contact and wire may be larger or smaller than the 24 AWG size or 28 AWG size.

Referring to FIG. 6, the connector 108 may include an insulator 232. The insulator 232 holds the contacts 230 and prevents the contacts from contacting each other. Referring to FIG. 10, the insulator 232 may include apertures 234 and the contacts 230 are positioned in the apertures 234. In one embodiment, the insulator 232 may include nineteen apertures 234. In other embodiments, the insulator may have more or less than nineteen apertures depending upon the number of contacts. The size of the aperture depends upon the size of the contact 230. In one embodiment, the contact may be retained in the aperture by epoxy. A small amount of epoxy may be applied to hold the contact into the aperture. In one embodiment, the insulator and the contact may include retention features which retain the contact in the insulator in a permanent manner, or non-permanent manner.

Referring to FIG. 6, the connector 108 may include a grounding shell 236. In one embodiment, the shell may be made of metal. In other embodiments, the shell may be made from other materials which may provide the EMI shielding as discussed herein. The insulator 232 will be positioned inside the shell 236.

Referring to FIG. 6, the shell 236 may include openings which expose portions of the insulator 232. The openings in the shell may provide access to the apertures 234 in the insulator 232. Referring to FIG. 6, the shell 236 may include a front opening 238. The front opening 238 provides access to the apertures 234. Referring to FIG. 6, the shell 236 may include a rear opening 240. The rear opening 240 provides access to the apertures 234.

When the connector is assembled onto the cable, the wires from the cable may be inserted into the apertures 234. The contact 230 may be attached to the wire prior to insertion into the aperture 234. In one embodiment, the contact 230 with the attached wire is inserted into the rear of the aperture 234.

Figure 9:
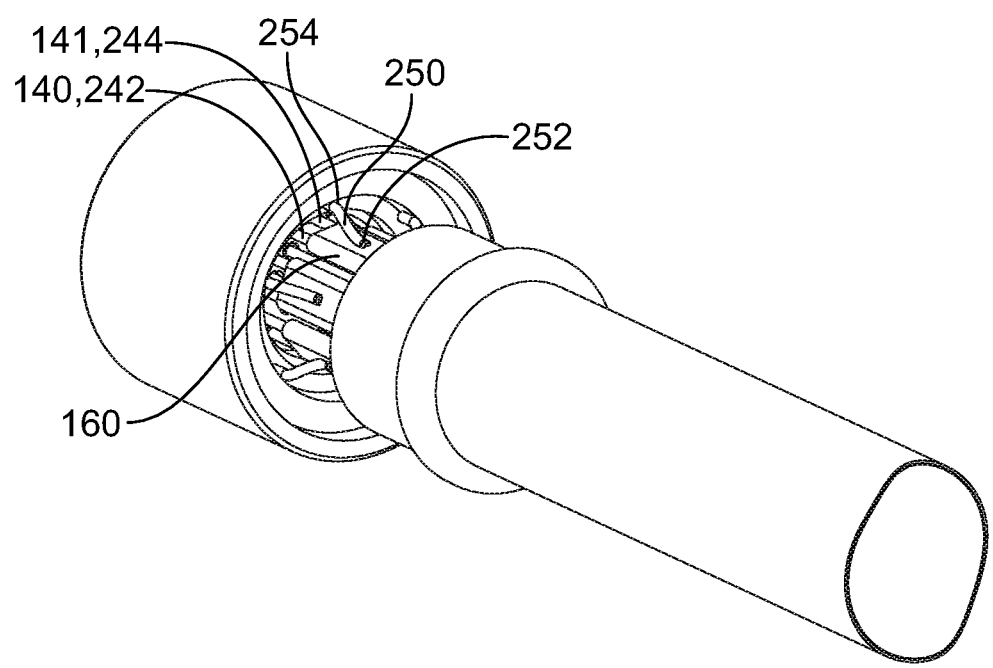
FIG. 9 is a perspective view of the termination of the cable.

Referring to FIG. 8, when the shielded twisted wire pair assemblies are assembled to the connector, a portion of the shielding near the connector may be removed to expose the wires. For example, a portion of the shielding 160 is removed to expose the wire pair 140, 141. The exposed portion of the wires 140, 141 is designated as 242, 244. FIG. 9 also shows the shielding 160 and the exposed portions 242, 244 of the wires 140, 141. Preferably, the least amount of shielding should be removed in order to reduce or eliminate EMI leakage. When the shielding is separated from the shielded twisted wire pair assembly, portions of the wires do not have the shielding. These exposed portions may cause EMI leakage. To reduce the EMI leakage, the shell encloses the exposed portions of the wires. As shown in FIG. 8, the shell 236 extends to cover the exposed portions of the wires. The exposed portions 242, 244 will be used as an example.

If the rear edge 246 of the shell is used to define a plane 248, the exposed portions 242, 244 of the wires are located inside the plane 248 of the shell.

In order to maintain the ground path for the shielding of the shielded twisted wire pairs, the shielding is connected to the shell. The shielding is connected to the shell 236 to maintain the ground along the signal paths for the wires. In one embodiment, the shielding for each wire pair can share the same ground path. Thus, the shielding for each shielded wire pair can be connected to the shell 236.

In one embodiment, a wire may be used to connect the shielding to the shell. Referring to FIGS. 8 and 9, the wire 250 may have a first end 252 and a second end 254. The first end 252 of the wire may be connected to the shielding 160. The second end 254 of the wire may be connected to the shell 236. In one embodiment, the wire may be connected by soldering. In other embodiments, the wire may be connected by mechanical retention, or other techniques.

In another embodiment, a portion of the shielding may be separated from the shielded twisted wire pair assembly. The separated portion of the shielding may be connected to the shell. In one embodiment, a thread from the braided shielding may be unwoven from the braid. The thread may be connected to the shell. In one embodiment, the thread may be connected by soldering the thread to the shell. In other embodiments, the thread may be retained by other techniques, such as, mechanical retention. In one embodiment, two threads may be unwoven from the braid. The two threads may be connected to the shell. The threads may be connected by soldering, mechanical retention or other technique.

Figure 11:
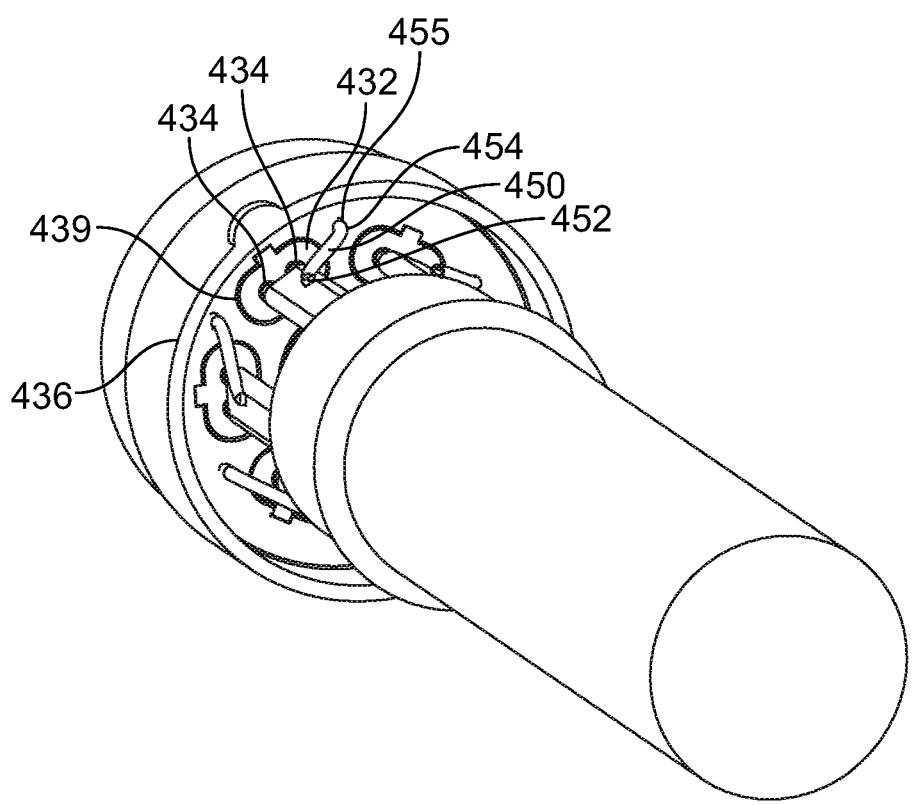
FIG. 11 is a rear perspective view of another embodiment of the connector.
Figure 12:
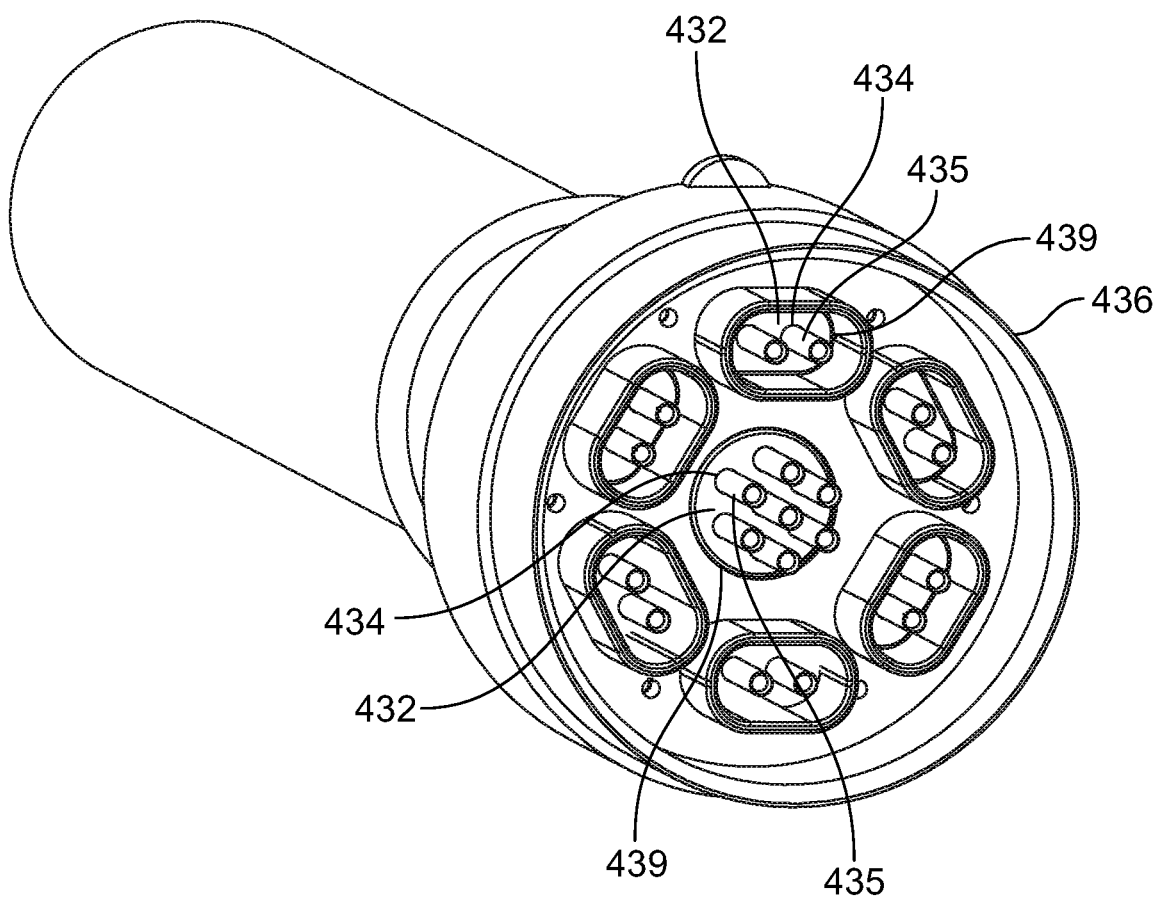
FIG. 12 is a front perspective view of the embodiment in FIG. 11.

Referring to FIGS. 11 and 12, another embodiment of the shell and insulator is shown. The shell 436 may include one or more openings 439 which expose portions of the insulator 432. The openings 439 in the shell may provide access to the apertures 434 in the insulator 432. The wires from the shielded twisted wire pair assemblies may be inserted into the apertures 434. The contact 435 may be attached to the wire prior to insertion into the aperture 434.

As noted herein, in order to maintain the ground path for the shielding, the shielding is connected to the shell. In one embodiment, a wire 450 may be used to connect the shielding 460 to the shell 436 as shown in FIG. 11. The wire 450 may have a first end 452 and a second end 454. The first end 452 of the wire may be connected to the shielding 460. The second end 454 of the wire may be connected to the shell 436. In one embodiment, the wire may be connected by soldering. In other embodiments, the wire may be connected by mechanical retention, or other techniques. In one embodiment, the second end 454 of the wire may be inserted into an opening 455 in the shell 436 and then connected by solder, mechanical retention, or other technique.

In another embodiment, a portion of the shielding may be separated from the shielded twisted wire pair. The separated portion may be connected to the shell. In one embodiment, a thread from the braided shielding may be unwoven from the braid. The thread may be inserted into an opening in the shell. The opening may include a chamfered leading edge to facilitate the insertion of the thread into the opening. The thread may be retained in the opening. In one embodiment, the thread may be retained by soldering the thread in the opening. In other embodiments, the thread may be retained by other techniques, such as, mechanical retention. In one embodiment, two threads may be unwoven from the braid. The two threads may be inserted into two openings. The threads may be retained in the openings.

An epoxy may be applied to the rear of the connector after the wire and ground connections have been completed.

Referring to FIGS. 6 and 8, the connector 108 may include an outer shell 260. The outer shell 260 may be used to connect the connector 108 to the connector 110. The connection between connector 108 and connector 110 may be a quick disconnect connection as will be discussed herein.

The outer shell 260 may shield the connector. As noted herein, the shielding layer 214 may be connected to the outer shell 260. The connection of the shielding layer 214 with the outer shell will create shielding along the cable. In one embodiment, the shielding layer 214 is connected to the outer shell 260 with band clamp 220.

The connector 108 may include an insulator between the outer shell and the inner shell to insulate the shielding from the ground path. In one embodiment, the connector may include insulator 262 as shown in FIGS. 6 and 8. The insulator 262 insulates the inner shell 236 from the outer shell 260.

The connector may include a ground contact. In one embodiment, the ground contact may be a ground spring 264 which is shown in FIGS. 8 and 10. In one embodiment, the ground spring may be a serpentine ground spring. The ground contact may facilitate or make the connection between the shell in connector 108 and connector 110.

The connector may include an orientation feature. In one embodiment, the orientation feature may be one or more keys 266 which are shown in FIG. 10. The keys 266 may mate with slots in connector 110. The orientation feature is used to obtain the proper orientation of the connectors 108, 110 during mating.

Figure 13:
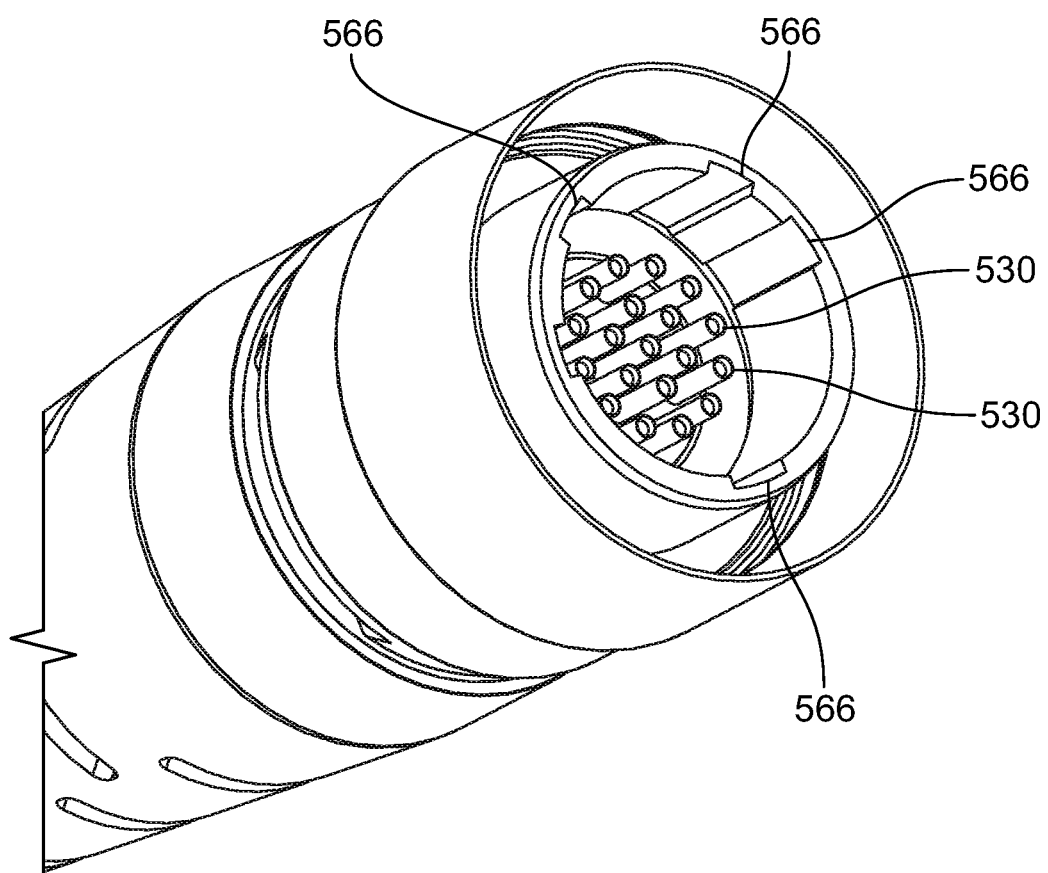
FIG. 13 is a perspective view of the male end of quick disconnect connector.

Referring to FIG. 6, the second connector 110 is similar to the first connector 108 except for changes to allow the connectors 108, 110 to mate together. Connector 110 uses female contacts 530 to connect with the male contacts 230 as shown in FIG. 13. Referring to FIG. 6, an insulator 532 holds the female contacts 530.

The shell 536 of the connector 110 mates with shell 236. A ground contact 264 may be used to make the connection between the shell 536 and the shell 236.

The connector 110 may include an insulator 562 to maintain the spacing between the inner shell 536 and the outer shell 560. The shielding layer of the cable may be connected to the outer shell 560 with band clamp 520.

The connector 110 may include an O-ring 563. The O-ring 563 may provide an environmental seal.

The connector 110 may include an orientation feature. In one embodiment, the orientation feature may be one or more slots 566 which are shown in FIG. 13. The slots 566 may mate with the keys 266 in connector 108 which are shown in FIG. 10.

Referring to FIG. 6, the connector 110 may include other components which are the same as in connector 108 including the strain relief boot 522, the band clamp 524, and the covering 526.

The connections of the wires and shielding for connector 110 would be the same as for connector 108.

Figure 14:
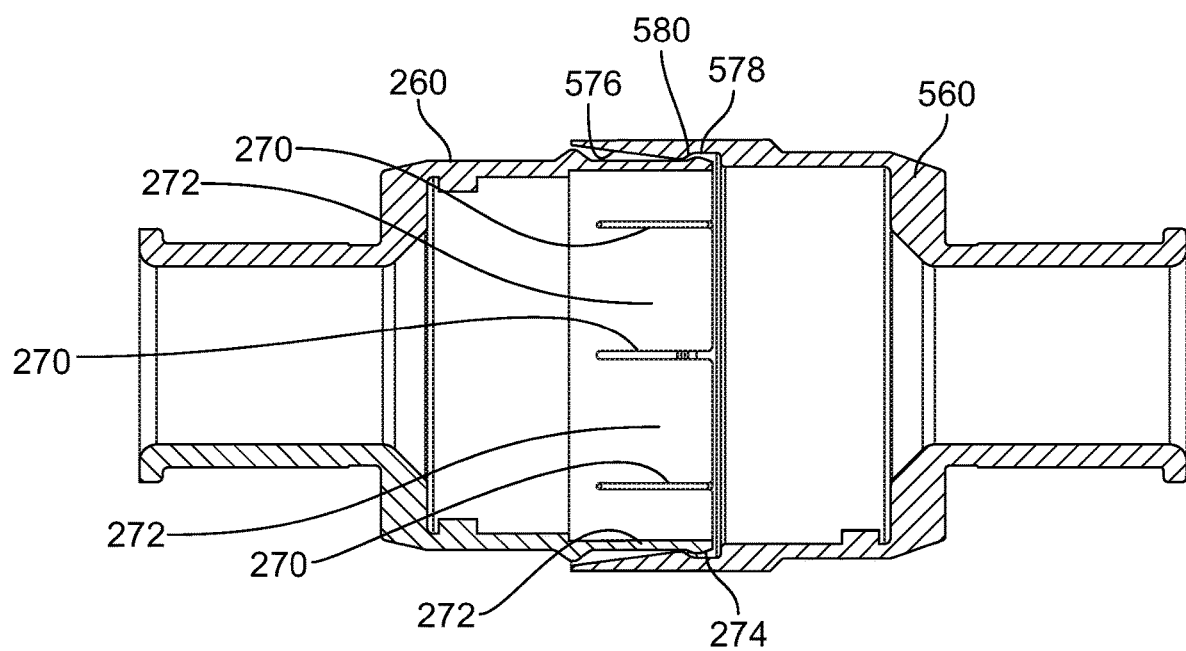
FIG. 14 is a cross-sectional view of the outer shells.

The connector pair 106 may be a quick disconnect connector. Referring to FIG. 6, the connector 108 and connector 110 may disconnect at 10-15 pounds. The outer shells 260, 560 facilitate the quick disconnect feature. Referring to FIG. 10, the outer shell 260 includes one or more slots 270. In one embodiment, the shell includes 8 slots. In other embodiments, the outer shell may include 1, 2, 3, 4, 5, 6, 7, 9 or more slots. The slots 270 allow a portion of the outer shell to become a cantilever beam 272 as shown in FIGS. 10 and 14. In one embodiment, the outer shell 260 may have eight-cantilever beams 272. In other embodiments, the outer shell may have 1, 2, 3, 4, 5, 6, 7, 9 or more beams.

The beams 272 are allowed to deflect during disengagement and engagement with the outer shell. The deflection can be used to control the amount of disconnect force. Other factors may also influence the disconnect force including material thickness, material composition, travel and exit angles. The designer would consider these factors to design shells with the desired disconnection force.

Referring to FIGS. 6 and 14, the outer shell 260 may include a latching protrusion 274. The protrusion 274 may be on one or more of the beams 272. In one embodiment, the protrusion may be on all of the beams. In one embodiment, the protrusion 274 may be located near the end of the beam. In other embodiments, the protrusion may be located in a different position.

The outer shell 560 may include a ramp 576. A portion of the outer shell 260 may engage the ramp 576 when the outer shell 260 and the outer shell 560 are mated. The engagement may cause the beam 272 to deflect. In one embodiment, the protrusion 274 may engage the ramp 576.

The outer shell 560 may include a detent 578. In one embodiment, the detent 578 may be a groove. The detent 578 may include a ramp 580. When the outer shell 260 and the outer shell 560 are mated, the protrusion 274 may engage the detent 578. The engagement may hold the outer shells 260, 560 together until the specified disconnection force is applied. When the specified disconnection force is applied, the beam 272 will deflect and allow the protrusion 274 and detent 578 to disengage.

Figure 15:
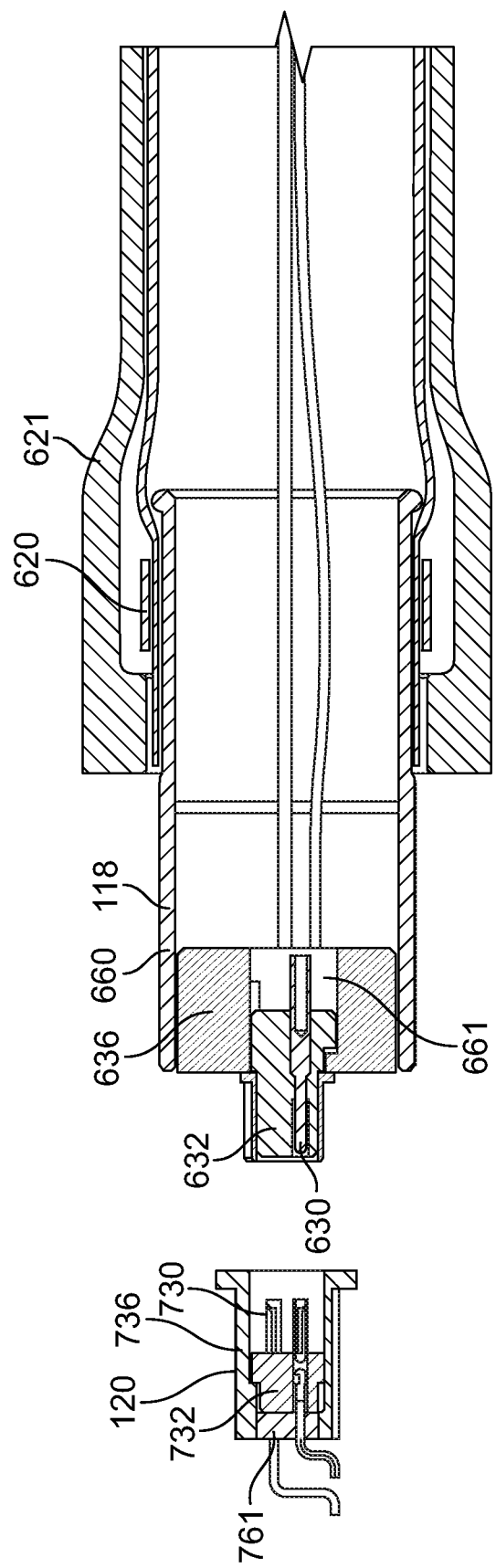
FIG. 15 is a cross-sectional view along line 15-15 in FIG. 3.
Figure 16:
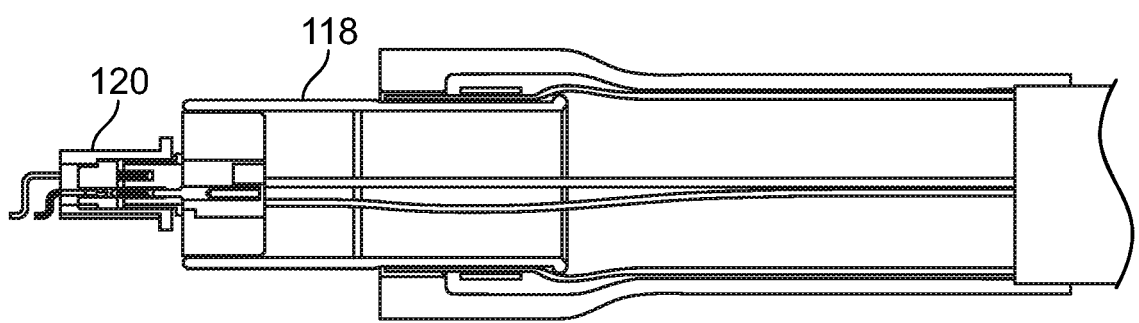
FIG. 16 is a cross-sectional view along line 16-16 in FIG. 4.

Referring to FIGS. 15 and 16, the connector 118 and connector 120 are shown. The connector 118 may be a Nano plug connector and the connector 120 may be a Nano socket connector.

The connector 118 may include contacts 630, an insulator 632, a plug shell 636, a backshell 660, epoxy 661, a band clamp 620, and covering 621. The wires are connected to the contacts 630. The wire and contact assembly is then inserted into the insulator 632. In one embodiment, the shield for the shielded twisted wire pair may be connected to a contact 630 which may be a ground contact. For example, the shield 160 for wire pair 140, 141 as shown in FIG. 5 may be connected to a contact 630. The shield may be connected to the contact with a soldered wire, with a portion of the shield, or with another technique. The insulator 632 is inserted onto the plug shell 636. The plug shell 636 is inserted into the backshell 660. An epoxy 661 is applied to the rear of the connector. The shielding layer 214 is connected to the backshell 660 with a band clamp 620. A covering 621 is applied over the band clamp 620. The covering 621 may be a heat shrink tubing.

The connector 120 may include male contacts 730, an insulator 732, a shell 736 and epoxy 761. The contacts 730 are attached to the insulator 732. The insulator 732 is inserted into the shell 736. An epoxy 761 is applied to the rear of the shell 736.

Referring to FIG. 16, the connector 118 may be connected to the connector 120.

Figure 17:
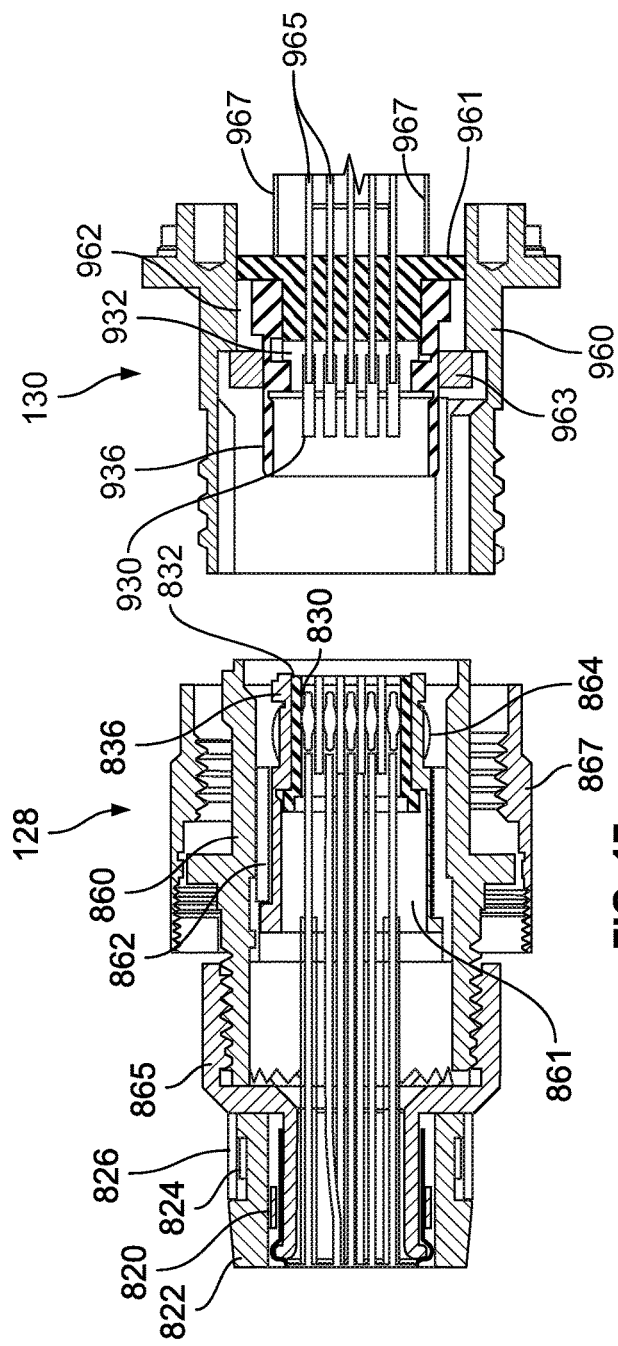
FIG. 17 is a cross-sectional view along line 17-17 in FIG. 3.
Figure 18:
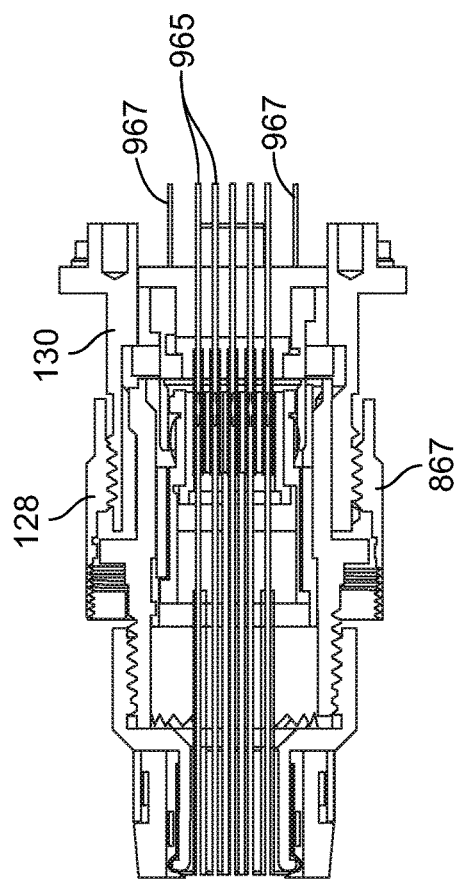
FIG. 18 is a cross-sectional view along line 18-18 in FIG. 4.

Referring to FIGS. 17 and 18, the connector 128 and connector 130 are shown. The connector 128 may be a 38999 plug connector and the connector 130 may be a 38999 socket connector.

The connector 128 may include female contacts 830, an insulator 832, a shell 836, a ground contact 864, an insulator 862, a plug shell 860, a backshell 865, a band clamp 820, a strain relief boot 822, a band clamp 824, a covering 826, and epoxy 861. The wires are connected to the contacts 830. The wire and contact assembly is then inserted into the insulator 832. The insulator 832 may be located inside the inner shell 836. The shield for the shielded twisted wire pairs may be attached to the inner shell 836 using the various techniques and embodiments discussed above with respect to the shell 236 and the shell 436. The inner shell 836 may include a ground contact 864. An epoxy 861 may be applied to the inner shell 836. An insulator 862 may be located between the inner shell 836 and the outer shell 860. A backshell 865 may be attached to the outer shell 860. The shielding layer 214 may be connected to the backshell 865 with a band clamp 820. A strain relief boot 822 may be attached with a band clamp 824. A covering 826 may be located over the band clamp 824. The connector 128 may include a circular nut 867 which may engage the connector 130.

The connector 130 may include male contacts 930, an insulator 932, a shell 936, an insulator 962, an outer shell 960, a gasket 963, and epoxy 961. The contacts 930 are located inside the insulator 932. Wires 965 may be connected to the contacts 930. The insulator 932 may be located inside the shell 936. One or more ground wires 967 may be connected to the inner shell 936. An insulator 962 may be located between the inner shell 936 and the outer shell 960. An epoxy 961 may be applied to the rear of the connector. The connector may include a gasket 963.

Referring to FIG. 18, the connector 128 may be connected to the connector 130. The circular nut 867 may be threaded onto the connector 130.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

Particular embodiments of the present invention are the following:

1. An electrical cable assembly comprising:
    an electrical cable, the cable including:
        a first twisted pair of electrical wires, the electrical wires conduct electrical signals;
        a first shield covering the first twisted pair of electrical wires;
        a second twisted pair of electrical wires, the electrical wires conduct electrical signals;
        a second shield covering the second twisted pair of electrical wires;
    an electrical connector including:
        electrical contacts, the electrical contacts conduct electrical signals, the electrical contacts connected to the electrical wires;
        an insulator, the insulator holds the electrical contacts;
        a grounding shell, the first shield and the second shield are connected to the grounding shell.
2. The electrical cable assembly of embodiment 1 wherein the first shield is connected to the grounding shell with a grounding wire.
3. The electrical cable assembly of embodiment 2 wherein the grounding wire is connected to the first shield by soldering and the grounding wire is connected to the grounding shell by soldering.
4. The electrical cable assembly of embodiment 1 wherein a portion of the first shield is connected to the grounding shell.
5. The electrical cable assembly of embodiment 4 wherein the portion of the first shield is connected to the grounding shell by soldering.
6. The electrical cable assembly of embodiment 1 wherein the connector includes a second shell, the second shell provides shielding.
7. The electrical cable assembly of embodiment 6 wherein an insulator is located between the grounding shell and the second shell.
8. The electrical cable assembly of embodiment 6 wherein the cable includes an outer shield which covers the first twisted pair of electrical wires, the first shield, the second twisted pair of electrical wires and the second shield.
9. The electrical cable assembly of embodiment 8 wherein the outer shield is connected to the second shell.
10. The electrical cable assembly of embodiment 1 wherein the electrical cable includes one or more wires.
11. The electrical cable assembly of embodiment 10 wherein the cable has a center, the one or more wires are located closer to the center than the first twisted pair of electrical wires.
12. The electrical cable assembly of embodiment 10 wherein the one or more wires are a third twisted pair of electrical wires.
13. The electrical cable assembly of embodiment 1 wherein the cable includes a fire resistant covering for the wires.
14. The electrical cable assembly of embodiment 1 wherein the cable includes filler strands.
15. An electrical cable assembly comprising:
    an electrical cable, the cable including:
        a first twisted pair of electrical wires, the electrical wires conduct electrical signals;
        a first shield covering the first twisted pair of electrical wires;
    an electrical connector including:
        electrical contacts, the electrical contacts to conduct electrical signals, the electrical contacts connected to the electrical wires;
        an insulator, the insulator holds the electrical contacts;
        a grounding shell, the grounding shell has a rear portion and the rear portion defines a rear boundary;
        a portion of the first shield is removed to terminate the first twisted pair of electrical wires to the contacts and the first twisted pair of electrical wires have portion which is not shielded by the first shield,
        the unshielded portion of the wires is within the rear boundary of the grounding shell.
16. The electrical cable of embodiment 15 wherein the first shield is connected to the grounding shell.
17. The electrical cable assembly of embodiment 15 wherein the cable includes a second twisted pair of electrical wires, the electrical wires conduct electrical signals; a second shield covering the second twisted pair of electrical wires, a portion of the second shield is removed to terminate the second twisted pair of electrical wires to the contacts and the second twisted pair of electrical wires have a portion which is not shielded by the second shield, the unshielded portion of the second twisted pair of electrical wires is within the rear boundary of the grounding shell.
18. The electrical cable assembly of embodiment 17 wherein the second shield is connected to the grounding shell.
19. The electrical cable assembly of embodiment 15 wherein the connector includes a second shell, the second shell provides shielding.
20. The electrical cable assembly of embodiment 19 wherein an insulator is located between the grounding shell and the second shell.
21. The electrical cable assembly of embodiment 19 wherein the cable includes an outer shield which covers the first twisted pair of electrical wires, the first shield, the second twisted pair of electrical wires and the second shield.
22. The electrical cable assembly of embodiment 21 wherein the outer shield is connected to the second shell.
23. The electrical cable assembly of embodiment 15 wherein the electrical cable includes one or more wires.
24. The electrical cable assembly of embodiment 15 wherein the electrical cable includes one or more wires.
25. The electrical cable assembly of embodiment 24 wherein the cable has a center, the one or more wires are located closer to the center than the first twisted pair of electrical wires.
26. The electrical cable assembly of embodiment 24 wherein the one or more wires are a third twisted pair of electrical wires.
27. The electrical cable assembly of embodiment 15 wherein the cable includes a fire resistant covering for the wires.
28. The electrical cable assembly of embodiment 15 wherein the cable includes filler strands.

29. An electrical connector assembly comprising:
   a first electrical connector including:
      first electrical contacts, the first electrical contacts conduct electrical signals;
      a first insulator, the first insulator holds the first electrical contacts;
      a first grounding shell, the first grounding shell includes a first slot, the first slot forms a first beam, the first beam includes a first protrusion;
   a second electrical connector including:
      second electrical contacts, the second electrical contacts conduct electrical signals;
      a second insulator, the second insulator holds the second electrical contacts;
      a second grounding shell, the second grounding shell includes a ramp and a detent, the first protrusion engages the detent when the connectors are mated.
30. The electrical connector assembly of embodiment 29 wherein the first grounding shell includes a second slot and a second beam.
31. The electrical connector assembly of embodiment 29 wherein the first grounding shell includes eight slots and eight beams.
32. The electrical connector assembly of embodiment 29 wherein the detent is a groove.
33. The electrical connector assembly of embodiment 29 wherein the first connector includes an inner shell.
34. The electrical connector assembly of embodiment 33 wherein an insulator is located between the grounding shell and the inner shell.
35. The electrical cable assembly of embodiment 29 wherein the electrical cable includes one or more wires.
36. The electrical cable assembly of embodiment 35 wherein the cable has a center, the one or more wires are located closer to the center than a first twisted pair of electrical wires.
37. The electrical cable assembly of embodiment 35 wherein the one or more wires are a third twisted pair of electrical wires.
38. The electrical cable assembly of embodiment 29 wherein the cable includes a fire resistant covering for the wires.
39. The electrical cable assembly of embodiment 29 wherein the cable includes filler strands.

The invention claimed is:
1. An electrical connector assembly comprising:
   a first electrical connector including:
   first electrical contacts, the first electrical contacts conduct electrical signals;
   a first insulator, the first insulator holds the first electrical contacts;
   a first outer shell, the first outer shell has a longitudinal axis, the first outer shell has a circular cross-section, the first outer shell is located over at least a portion of the first insulator, the first outer shell includes a first slot, the first slot extends along the longitudinal axis the first slot forms a first beam, the first beam includes a first protrusion;
   a second electrical connector including:
   second electrical contacts, the second electrical contacts conduct electrical signals;
   a second insulator, the second insulator holds the second electrical contacts;
   a second outer shell, the second outer shell has a circular cross-section, the second outer shell is located over at least a portion of the second insulator, the second outer shell includes a ramp and a detent, the first protrusion engages the detent when the connectors are mated.

2. The electrical connector assembly as in claim 1 wherein the first outer shell includes a second slot and a second beam.

3. An electrical connector assembly comprising:
   a first electrical connector including:
   first electrical contacts, the first electrical contacts conduct electrical signals;
   a first insulator, the first insulator holds the first electrical contacts;
   a first outer shell, the first outer shell has a circular cross-section, the first outer shell is located over at least a portion of the first insulator, the first outer shell includes a first slot, the first slot forms a first beam, the first beam includes a first protrusion;
   a first inner shell, the first outer shell is located over at least a portion of the first inner shell;
   a second electrical connector including:
   second electrical contacts, the second electrical contacts conduct electrical signals;
   a second insulator, the second insulator holds the second electrical contacts;
   a second outer shell, the second outer shell has a circular cross-section, the second outer shell is located over at least a portion of the second insulator, the second outer shell includes a ramp and a detent, the first protrusion engages the detent when the connectors are mated.

4. The electrical connector assembly as in claim 3 wherein the first outer shell includes a second slot and a second beam.

5. The electrical connector assembly as in claim 3 wherein the first outer shell includes seven additional slots and seven additional beams.

6. The electrical connector assembly as in claim 3 wherein the detent is a groove.

7. The electrical connector assembly as in claim 4 wherein the second beam includes a second protrusion.

8. The electrical connector assembly as in claim 5 wherein each of the seven additional beams includes a protrusion.

9. The electrical connector assembly as in claim 3 further includes an electrical cable, the electrical cable includes one or more wires.

10. The electrical connector assembly as in claim 3 further includes an electrical cable, the electrical cable includes a first twisted pair of electrical wires, the electrical wires conduct electrical signals, a first shield covering the first twisted pair of electrical wires.

11. The electrical connector assembly as in claim 10 wherein the first shield is connected to the first inner shell.

12. The electrical connector assembly as in claim 11 wherein the cable includes an outer shield which covers at least the first twisted pair of electrical wires and the first shield, the outer shield is connected to at least one of the first outer shell or the second outer shell.

13. The electrical connector assembly as in claim 3 further includes a shell insulator, the shell insulator is located between the first inner shell and the first outer shell.

14. An electrical connector assembly comprising:
   a first electrical connector including:
   first electrical contacts, the first electrical contacts conduct electrical signals;
   a first insulator, the first insulator holds the first electrical contacts;
   a first outer shell, the first outer shell has a circular cross-section, the first outer shell is located over at least a portion of the first insulator, the first outer shell includes a first slot, the first slot forms a first beam, the first beam includes a first protrusion, the first outer shell includes seven additional slots and seven additional beams;

a second electrical connector including:

second electrical contacts, the second electrical contacts conduct electrical signals;

a second insulator, the second insulator holds the second electrical contacts;

a second outer shell, the second outer shell has a circular cross-section, the second outer shell is located over at least a portion of the second insulator, the second outer shell includes a ramp and a detent, the first protrusion engages the detent when the connectors are mated.

15. The electrical connector assembly as in claim 14 wherein the detent is a groove.

16. The electrical connector assembly as in claim 14 wherein each of the seven additional beams includes a protrusion.

17. The electrical connector assembly as in claim 14 further includes an electrical cable, the electrical cable includes one or more wires.

18. The electrical connector assembly as in claim 14 further includes an electrical cable, the electrical cable includes a first twisted pair of electrical wires, the electrical wires conduct electrical signals, a first shield covering the first twisted pair of electrical wires.

19. The electrical connector assembly as in claim 18 further includes an inner shell, the first shield is connected to the inner shell.

20. The electrical connector assembly as in claim 18 wherein the cable includes an outer shield which covers at least the first twisted pair of electrical wires and the first shield, the outer shield is connected to at least one of the first outer shell or the second outer shell.

21. The electrical connector assembly as in claim 1 wherein the detent is a groove.

22. The electrical connector assembly as in claim 21 wherein the second beam includes a second protrusion.

23. The electrical connector assembly as in claim 1 further includes an electrical cable, the electrical cable includes one or more wires.

24. The electrical connector assembly as in claim 1 further includes an electrical cable, the electrical cable includes a first twisted pair of electrical wires, the electrical wires conduct electrical signals, a first shield covering the first twisted pair of electrical wires.

25. The electrical connector assembly as in claim 24 wherein the first electrical connector includes a first inner shell, the first outer shell is located over at least a portion of the first inner shell, the first shield is connected to the first inner shell.

26. The electrical connector assembly as in claim 25 wherein the cable includes an outer shield which covers at least the first twisted pair of electrical wires and the first shield, the outer shield is connected to at least one of the first outer shell or the second outer shell.

27. The electrical connector assembly as in claim 25 further includes a shell insulator, the shell insulator is located between the first inner shell and the first outer shell.

* * * * *